(12) United States Patent
Pan et al.

(10) Patent No.: US 9,607,959 B2
(45) Date of Patent: Mar. 28, 2017

(54) PACKAGING DEVICE HAVING PLURAL MICROSTRUCTURES DISPOSED PROXIMATE TO DIE MOUNTING REGION

(71) Applicant: Taiwan Semiconductor Manufacturing Company, Ltd., Hsin-Chu (TW)

(72) Inventors: Kuo Lung Pan, Hsin-Chu (TW);
Yu-Feng Chen, Hsin-Chu (TW);
Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 113 days.

(21) Appl. No.: 14/470,765

(22) Filed: Aug. 27, 2014

(65) Prior Publication Data

US 2016/0064348 A1    Mar. 3, 2016

(51) Int. Cl.
*H01L 23/31*    (2006.01)
*H01L 23/00*    (2006.01)
(Continued)

(52) U.S. Cl.
CPC ............ *H01L 24/17* (2013.01); *H01L 21/563* (2013.01); *H01L 23/3157* (2013.01); *H01L 23/49827* (2013.01); *H01L 23/49838* (2013.01); *H01L 24/05* (2013.01); *H01L 24/81* (2013.01); *H01L 25/0652* (2013.01); *H01L 25/0655* (2013.01); *H01L 25/0657* (2013.01); *H01L 25/50* (2013.01); *H01L 2224/0226* (2013.01); *H01L 2224/02245* (2013.01); *H01L 2224/02251* (2013.01); *H01L 2224/10175* (2013.01); *H01L 2224/131* (2013.01); *H01L 2224/13025* (2013.01); *H01L 2224/13147* (2013.01); *H01L 2224/13687* (2013.01); *H01L 2224/1411* (2013.01); *H01L 2224/16146* (2013.01); *H01L 2224/16227* (2013.01); *H01L 2224/16235* (2013.01); *H01L 2224/1703* (2013.01); *H01L 2224/17181* (2013.01);
(Continued)

(58) Field of Classification Search
CPC .............................................. H01L 2224/10175
See application file for complete search history.

(56) References Cited

U.S. PATENT DOCUMENTS 4,967,313 A * 10/1990 Berner .................... H01L 24/16
257/E21.511
6,201,266 B1 * 3/2001 Ohuchi ................... H01L 23/13
257/106
(Continued)

*Primary Examiner* — Stephen W Smoot
(74) *Attorney, Agent, or Firm* — Slater Matsil, LLP

(57) ABSTRACT

An example packaging device includes a substrate having an integrated circuit die mounting region disposed thereon. A plurality of microstructures are disposed proximate a side of the integrated circuit die mounting region. The plurality of microstructures each include an outer insulating layer over a conductive material. An example packaged semiconductor device includes a substrate having an integrated circuit die mounting region disposed thereon. A plurality of columnar microstructures are disposed on the substrate perpendicular to a major surface of the substrate and proximate a side of the integrated circuit die mounting region. An underfill material is disposed between the substrate and the integrated circuit die.

20 Claims, 12 Drawing Sheets

(51) Int. Cl.
*H01L 23/498* (2006.01)
*H01L 25/065* (2006.01)
*H01L 21/56* (2006.01)
*H01L 25/00* (2006.01)

(52) U.S. Cl.
CPC ............ *H01L 2224/26145* (2013.01); *H01L 2224/26175* (2013.01); *H01L 2224/32145* (2013.01); *H01L 2224/32225* (2013.01); *H01L 2224/73204* (2013.01); *H01L 2224/81192* (2013.01); *H01L 2224/81805* (2013.01); *H01L 2224/92125* (2013.01); *H01L 2225/06513* (2013.01); *H01L 2225/06517* (2013.01); *H01L 2225/06541* (2013.01); *H01L 2225/06548* (2013.01); *H01L 2924/01029* (2013.01); *H01L 2924/0541* (2013.01); *H01L 2924/05042* (2013.01)

(56) References Cited

U.S. PATENT DOCUMENTS

| | | | | |
|---|---|---|---|---|
| 9,287,194 | B2 * | 3/2016 | Hung | H01L 23/48 |
| 2008/0179738 | A1 * | 7/2008 | Nishimura | H01L 21/563 257/737 |
| 2008/0237895 | A1 * | 10/2008 | Saeki | H01L 23/3157 257/787 |
| 2008/0315410 | A1 * | 12/2008 | Johnson | H01L 21/563 257/737 |
| 2010/0283085 | A1 * | 11/2010 | Bemanian | H01L 24/14 257/209 |

* cited by examiner

PACKAGING DEVICE HAVING PLURAL MICROSTRUCTURES DISPOSED PROXIMATE TO DIE MOUNTING REGION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
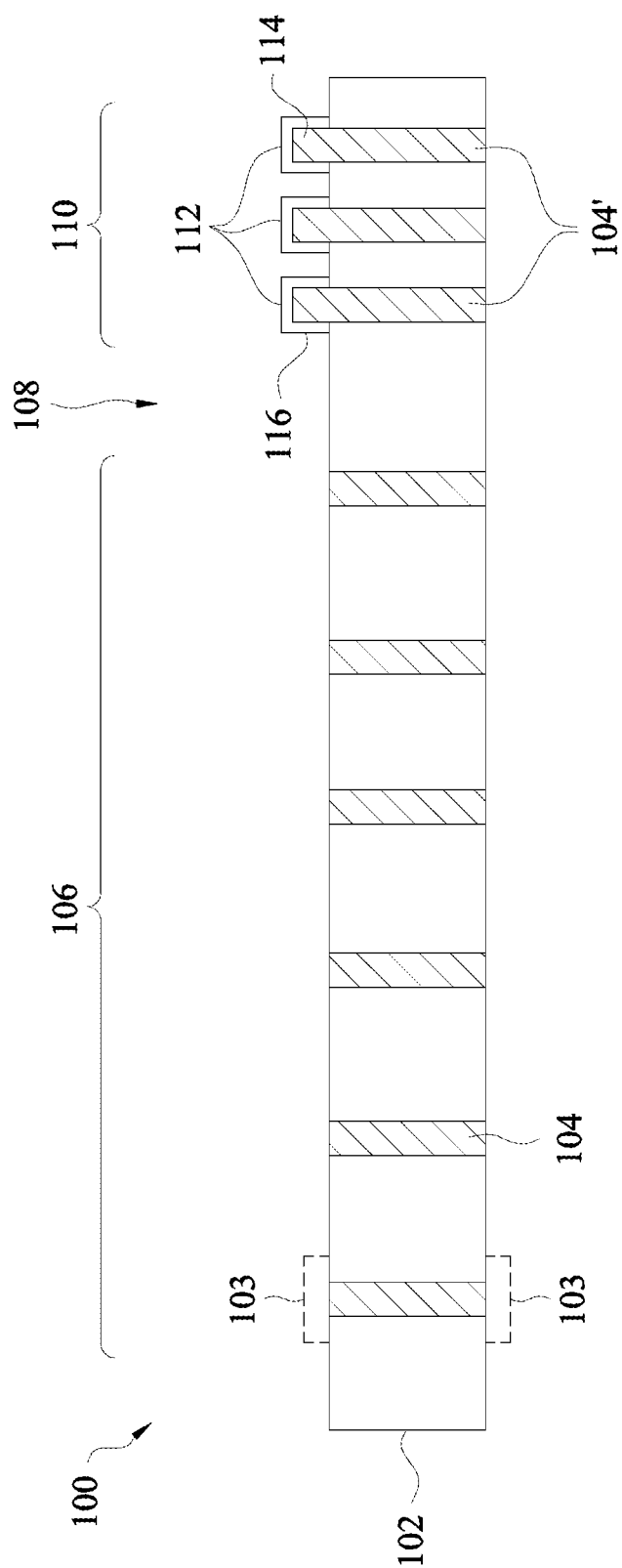
FIG. 1 is a cross-sectional view of a packaging device in accordance with some embodiments of the present disclosure, wherein a plurality of microstructures is disposed proximate a side of an integrated circuit die mounting region of a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide novel packaging devices for semiconductor devices, packaged semiconductor devices, and packaging methods for semiconductor devices. The devices and methods utilize a novel plurality of microstructures to control an application and flow of an underfill material, which will be described further herein.

Referring first to FIG. 1, there is shown a cross-sectional view of a packaging device 100 in accordance with some embodiments of the present disclosure. The packaging device 100 includes a plurality of microstructures 110 disposed proximate a side 108 of an integrated circuit die mounting region 106 of a substrate 102.

The substrate 102 comprises an interposer substrate or an integrated circuit die in some embodiments. The substrate 102 may comprise a high-density interconnect substrate, a silicon or other semiconductive material substrate, an organic substrate, a ceramic substrate, a dielectric substrate, a laminate substrate, or the like. The substrate 102 may comprise an interposer substrate that has an interconnect structure (not shown) disposed proximate contact pads (one contact pad is shown in phantom at 103) formed on the substrate 102. The contact pads 103 are disposed on one or both sides of the substrate 102 and may be arranged in an array of fully populated or partially populated rows and columns, for example. The contact pads 103 may make electrical contact with conductive features (not shown) within the substrate 102, such as conductive lines, vias, and conductive pads, as examples. In other embodiments, contact pads 103 are not included on the substrate 102. The substrate 102 may, or may not, have active or passive components formed thereon.

In some embodiments, the substrate 102 includes a plurality of through-vias 104 formed thereon. The through-vias 104 provide vertical electrical connections for the substrate 102. In embodiments wherein the substrate 102 includes contact pads 103 formed thereon, some of the contact pads 103 may be coupled to the through-vias 104, for example. The through-vias 104 comprise a metal or other conductive material. In some embodiments, the through-vias 104 comprise copper, a copper alloy, or other materials, for example. The through-vias 104 may be formed by drilling holes in the substrate 102, and filling the holes with conductive material, for example. The through-vias 104 may alternatively be formed using other methods, such as plating or photolithography, as examples.

The substrate 102 includes an integrated circuit die mounting region 106 disposed thereon. The integrated circuit die mounting region 106 comprises a region wherein an integrated circuit die will be attached, e.g., using connectors such as solder balls, to the substrate 102. The integrated circuit die mounting region 106 may be square, rectangular, or other shapes in a top view of the substrate 102.

A plurality of microstructures 110 is disposed proximate a side 108 of the integrated circuit die mounting region 106 of the substrate 102. The plurality of microstructures 110 comprises a plurality of bumps or pillars 112 that extends vertically away from the substrate 102. In some embodiments, each of the plurality of bumps or pillars 112 of the plurality of microstructures 110 extends from a through-via 104' in the substrate 102, as illustrated in FIG. 1. In other embodiments, the plurality of bumps or pillars 112 of the plurality of microstructures 110 does not extend from a through-via 104' in the substrate 102; rather, the plurality of bumps or pillars 112 of the plurality of microstructures 110 is formed directly over the substrate 102 (see the embodiments shown in FIG. 18).

Referring again to FIG. 1, each of the plurality of bumps or pillars 112 of the plurality of microstructures 110 comprises a conductive material 114 and an insulating material 116 disposed over the conductive material 114. The conductive material 114 comprises the same material as the through-vias 104 and 104' in some embodiments. The conductive material 114 comprises copper, a copper alloy, or other materials in some embodiments, for example. The insulating material 116 comprises an oxide or nitride material in some embodiments. The insulating material 116 comprises copper oxide, silicon nitride, or a combination or multiple layers thereof in some embodiments, as examples. The insulating material 116 lines the top surfaces and sidewalls of the conductive material 114 of the plurality of bumps or pillars 112 of the plurality of microstructures 110.

The insulating material 116 of the plurality of bumps or pillars 112 of the plurality of microstructures 110 comprises a material that is hydrophobic in some embodiments. Thus, the plurality of microstructures 110 is hydrophobic, for example. The surface of the plurality of microstructures 110 is nonpolar in some embodiments, and thus tends to aggregate in an aqueous solution and repel water and other liquids. The hydrophobic quality of the microstructures 110 is advantageous in accordance with some embodiments of the present disclosure, because when a liquid underfill material (see underfill material 126 shown in FIGS. 3 and 4) is applied in a subsequent processing or packaging step, the plurality of microstructures 110 repels the underfill material 126, thus prohibiting the underfill material 126 from passing through the plurality of microstructures 110.

Figure 2:
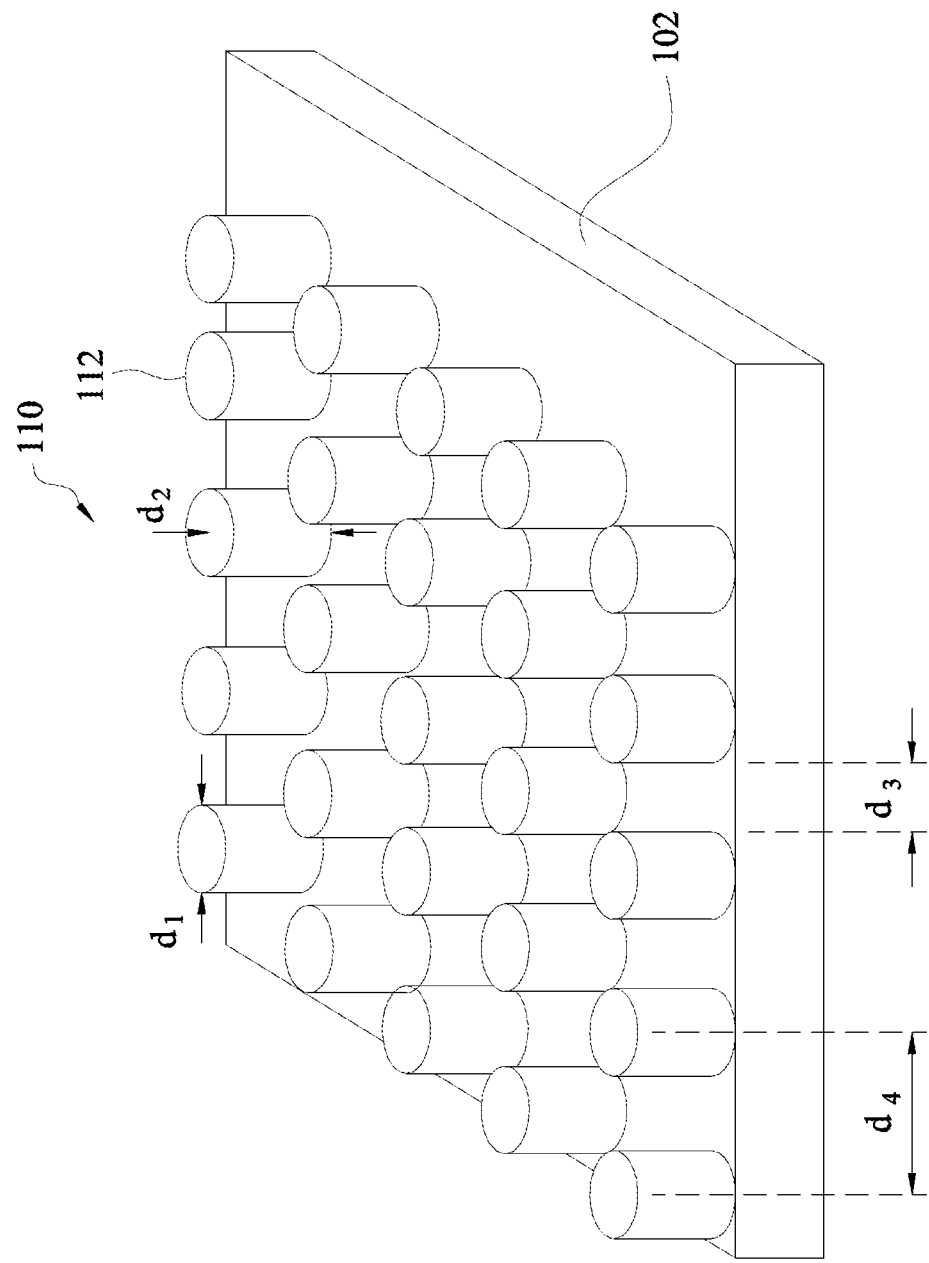
FIG. 2 is a perspective view of the plurality of microstructures shown in FIG. 1 in accordance with some embodiments.

FIG. 2 is a perspective view of the plurality of microstructures 110 shown in FIG. 1 in accordance with some embodiments. Only three microstructures 110 are shown in FIG. 1; however, the plurality of microstructures 110 may comprise an array of the microstructures 110 arranged in rows and columns, as illustrated in FIG. 2. Five rows and columns of microstructures 110 are shown in FIG. 2; however, the plurality of microstructures 110 may comprise fewer than five rows and/or columns, or greater than five rows and/or columns, in some embodiments. The number of rows and columns of the plurality of microstructures 110 may be the same, or different, for example. The array of microstructures 110 may also be staggered.

Each of the plurality of microstructures 110 comprises a bump or pillar 112 that extends from the top surface of the substrate 102. Each of the plurality of bumps or pillars 112 comprise a width comprising dimension $d_1$, wherein dimension $d_1$ comprises about 5 μm to about 100 μm in some embodiments. Each of the plurality of bumps or pillars 112 comprise a height comprising dimension $d_2$, wherein dimension $d_2$ comprises about 10 μm to about 100 μm in some embodiments. The bumps or pillars 112 are spaced apart from adjacent bumps or pillars 112 by an amount comprising dimension $d_3$, wherein dimension $d_3$ comprises about 5 μm to about 80 μm in some embodiments. The bumps or pillars 112 comprise a center-to-center spacing comprising dimension $d_4$, wherein dimension $d_4$ comprises about 10 μm to about 180 μm in some embodiments. Alternatively, the plurality of bumps or pillars 112 may comprise other dimensions or other relative dimensions.

Figure 3:
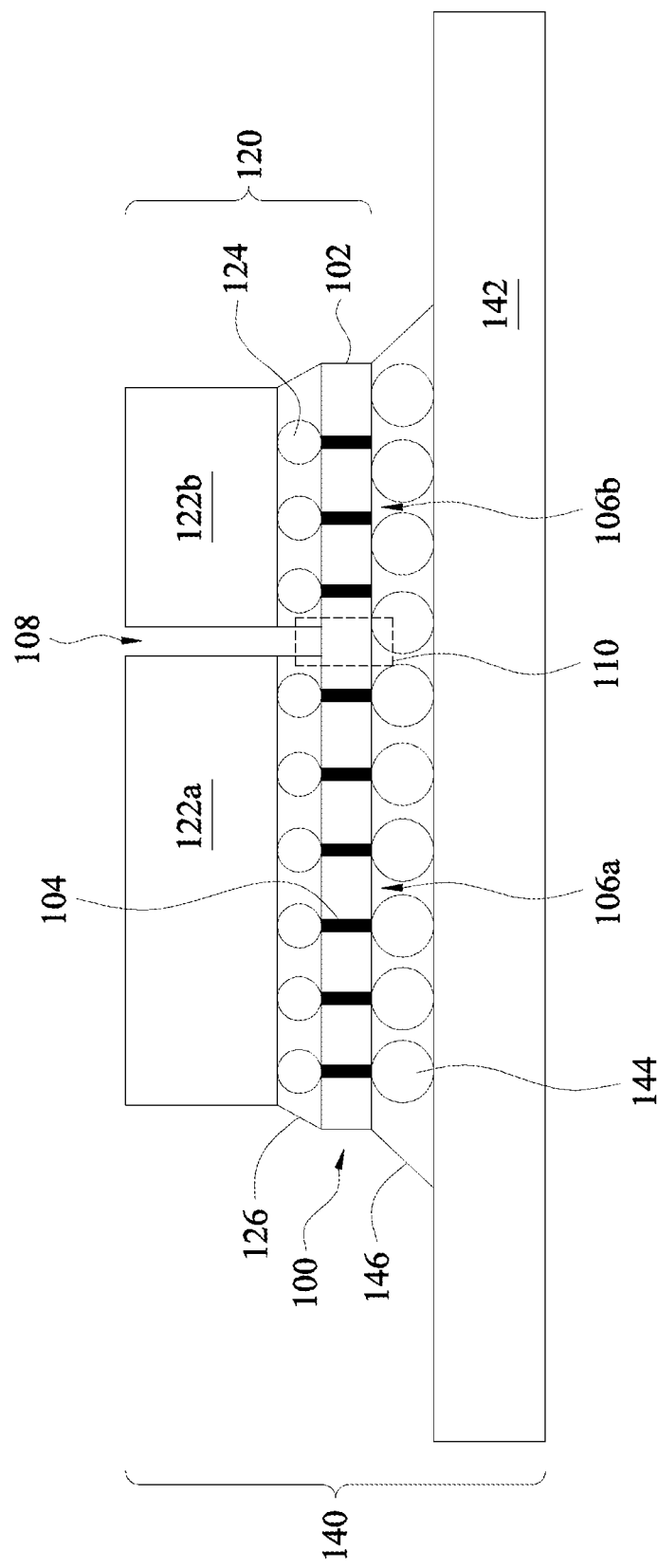
FIG. 3 is a cross-sectional view of a packaged semiconductor device in accordance with some embodiments that includes the plurality of microstructures.
Figure 4:
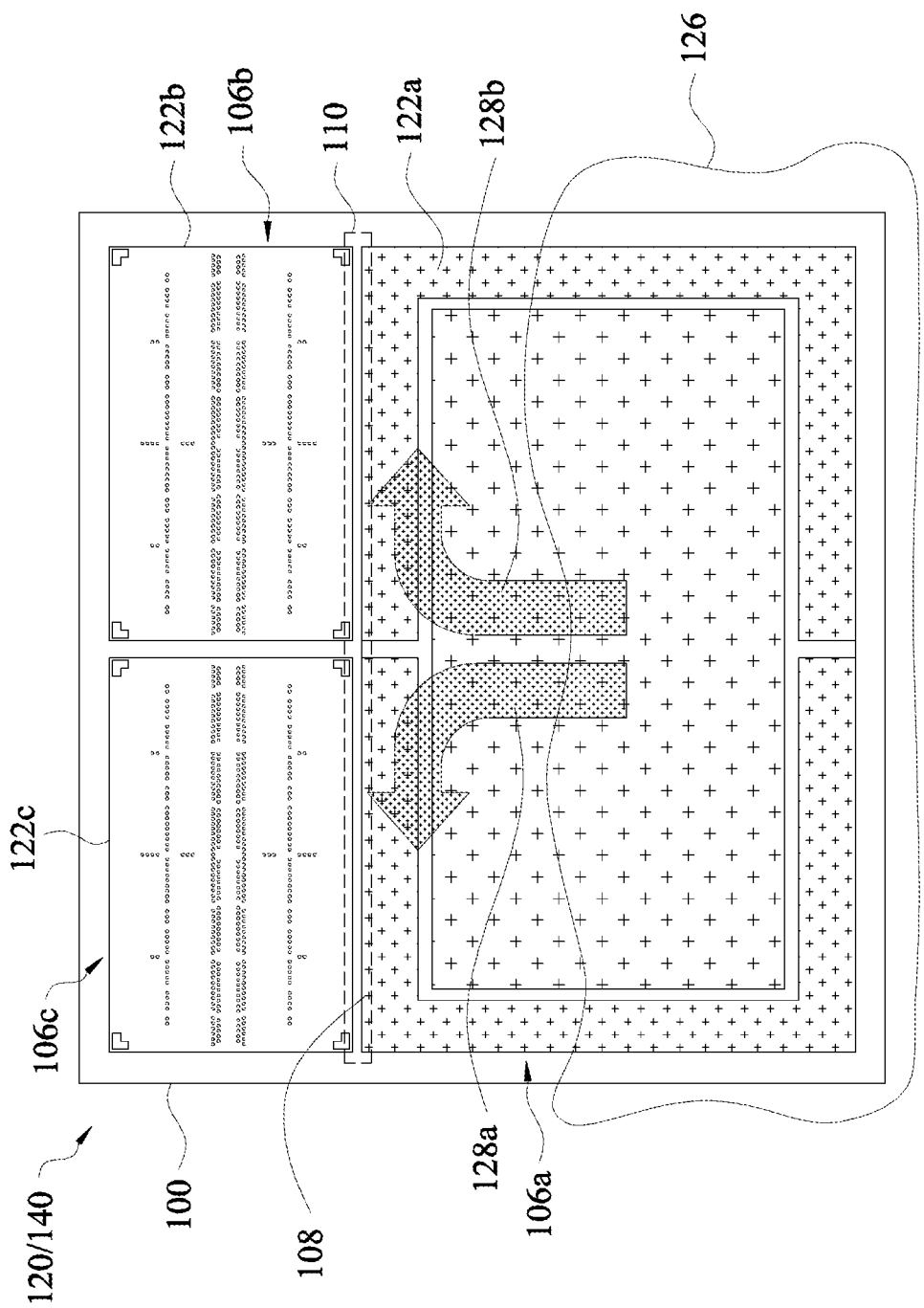
FIG. 4 is a top view of the packaged semiconductor device shown in FIG. 4 in accordance with some embodiments, illustrating an application of an underfill material between an integrated circuit die and a substrate.

FIG. 3 is a cross-sectional view and FIG. 4 is a top view of a packaged semiconductor device 120 and/or 140 in accordance with some embodiments of the present disclosure that includes the plurality of microstructures 110 disposed on a packaging device 100 on a side 108 of an integrated circuit die mounting region 106a. Packaged semiconductor device 120 includes a plurality of integrated circuit dies 122a, 122b, and 122c mounted on and coupled to a plurality of integrated circuit die mounting regions 106a, 106b, and 106c, respectively, disposed on the substrate 102 of the packaging device 100. The integrated circuit dies 122a, 122b, and 122c are packaged together horizontally over the packaging device 100. Three integrated circuit dies 122a, 122b, and 122c are shown in FIGS. 3 and 4; alternatively, two integrated circuit dies, or four or more integrated circuit dies, may be packaged together in a lateral or horizontal direction over a packaging device 100, in accordance with some embodiments.

The packaged semiconductor device 120 includes an integrated circuit die 122a coupled to the integrated circuit die mounting region 106a of the packaging device 100 by a plurality of connectors 124. The plurality of connectors 124 comprises a eutectic material such as solder, for example. The connectors 124 may comprise copper pillars, copper bumps, solder bumps, controlled collapse chip connection (C4) bumps, combinations thereof, or other types of connectors, as examples. The packaged semiconductor device 120 also includes an integrated circuit die 122b coupled to an integrated circuit die mounting region 106b of the packaging device 100 and an integrated circuit die 122c coupled to an integrated circuit die mounting region 106c of the packaging device 100 by a plurality of the connectors 124. One side of the connectors 124 is coupled to through-vias 104 or contact pads 103 (see FIG. 1) of the packaging device 100, and an opposite side of the connectors 124 is coupled to the integrated circuit dies 122a, 122b, and 122c (i.e., to contact pads disposed on the integrated circuit dies 122a, 122b, and 122c, not shown). The connectors 124 may be attached to the packaging device 100, to the integrated circuit dies 122a, 122b, and 122c, or to both. The integrated circuit dies 122a, 122b, and 122c are aligned with the integrated circuit die mounting regions 106a, 106b, and 106c, and a eutectic material of the connectors 124 is heated to reflow the eutectic material. The eutectic material is then allowed to cool, leaving the integrated circuit dies 122a, 122b, and 122c bonded to the packaging device 100 by the connectors 124.

The plurality of microstructures 110 is disposed on a side 108 of the integrated circuit die mounting region 106a that is proximate the integrated circuit die mounting regions 106b and 106c. The plurality of microstructures 110 is disposed between the integrated circuit die mounting region 106a and the integrated circuit die mounting regions 106b and 106c, as can be seen in the top view in FIG. 4, for example. The plurality of microstructures 110 advantageously functions as a barrier that prevents the flow of underfill material 126 past the microstructures 110.

The underfill material 126 may comprise an epoxy, an organic polymer, an organic resin, or a polymer with or without a silica-based or glass filler added, as examples. In some embodiments, the underfill material 126 comprises a liquid molding compound (LMC) that is a gel type liquid when applied. The underfill material 126 is allowed to cure or is cured after the application thereof, using heat, ultraviolet (UV) light, or other methods. Alternatively, the underfill material 126 may comprise other types of insulating and/or encapsulating materials. The underfill material 126 encapsulates the connectors 124 and provides protection from thermal and structural stresses, for example.

In some embodiments, all of the integrated circuit dies 122a, 122b, and 122c are first coupled to the packaging device 100 using the connectors 124, and then the underfill material 126 is applied between the dies 122a, 122b, and 122c and the substrate 102 of the packaging device 100. The underfill material 126 may be applied using a needle or dispensing tool along the lower edge of the dies 122a, 122b, and 122c, manually or using an automated machine, for example. The plurality of microstructures 110 prevents overflow from beneath integrated circuit die 122a towards integrated circuit dies 122b and 122c during the application of the underfill material 126 and during a subsequent curing process for the underfill material 126. Likewise, the plurality of microstructures 110 prevents overflow from beneath integrated circuit dies 122b and 122c towards integrated circuit die 122a during the application and curing of the underfill material 126.

In other embodiments, integrated circuit die 122a is first coupled to the integrated circuit die mounting region 106a of the packaging device 100 using the connectors 124, and the underfill material 126 is applied between the die 122a and the substrate 102 of the packaging device 100. The plurality of microstructures 110 prevents overflow from beneath integrated circuit die 122a towards the integrated circuit die mounting regions 106b and 106c during the application of the underfill material 126 and during a subsequent curing process for the underfill material 126 beneath the integrated circuit die 122a. The plurality of microstructures 110 prevents the underfill material 126 from forming on the integrated circuit die mounting regions 106b and 106c, which would interfere with the attachment of the integrated circuit dies 122b and 122c to the integrated circuit die mounting regions 106b and 106c, respectively, for example. Next, the integrated circuit dies 122b and 122c are coupled to the integrated circuit die mounting regions 106b and 106c, respectively, of the packaging device 100 using the connectors 124, and an underfill material 126 is applied between the dies 122b and 122c and the substrate 102 of the packaging device 100. The plurality of microstructures 110 also prevents overflow from beneath the integrated circuit dies 122b and 122c towards the integrated circuit die 122a during the application and curing of the underfill material 126 beneath the dies 122b and 122c.

Referring again to FIG. 2, in some embodiments, dimension $d_2$ comprising the height of the plurality of microstructures 100 is less than a height of the connectors 124, to avoid interference with the attachment of the dies 122a, 122b, and 122c to the packaging device 100, for example.

In some embodiments, the packaged semiconductor device 120 is then coupled to another substrate 142 by a plurality of connectors 144 to form a packaged semiconductor device 140, also shown in FIG. 3. Substrate 102 of the packaging device 100 comprises a first substrate 102 in some embodiments, and substrate 142 comprises a second substrate 142, for example. The second substrate 142 comprises a printed circuit board (PCB) in some embodiments. Alternatively, the second substrate 142 may comprise other types of substrates. The connectors 144 comprise solder balls and are larger than connectors 124 between the dies 122a, 122b, and 122c and the first substrate 102 in some embodiments. Alternatively, the connectors 144 may comprise other types of connectors and relative sizes. An underfill material 146 comprising similar materials as described for underfill material 126 may be disposed or applied between the first substrate 102 and the second substrate 142, encapsulating the connectors 144, in some embodiments. In other embodiments, the packaged semiconductor device 120 is not coupled to another substrate 142.

FIG. 4 also illustrates the application of the underfill material 126 between the integrated circuit die 122a and the packaging device 100 (e.g., the substrate 102 of the packaging device 100). The direction of the underfill material 126 flow is indicated by arrows 128a and 128b. The flow of the underfill material 126 is deflected by the novel plurality of microstructures 110 towards the left (arrow 128a) and towards the right (arrow 128b) in the view shown in FIG. 4, for example.

Air gaps can be maintained between adjacent integrated circuit dies 122a, 122b, and 122c because the flow of the underfill material 126 past the microstructures 110 is prevented or reduced, which is advantageous in embodiments wherein integrated circuit dies 122a, 122b, and/or 122c require increased thermal dissipation.

In the embodiments shown in FIGS. 3 and 4, multiple dies 122a, 122b, and 122c are packaged in a single layer over the packaging device 100, in a three-dimensional integrated circuit (3DIC) application. In other embodiments, multiple integrated circuit dies can be stacked vertically over a packaging device 100 in a 3DIC application.

Figure 5:
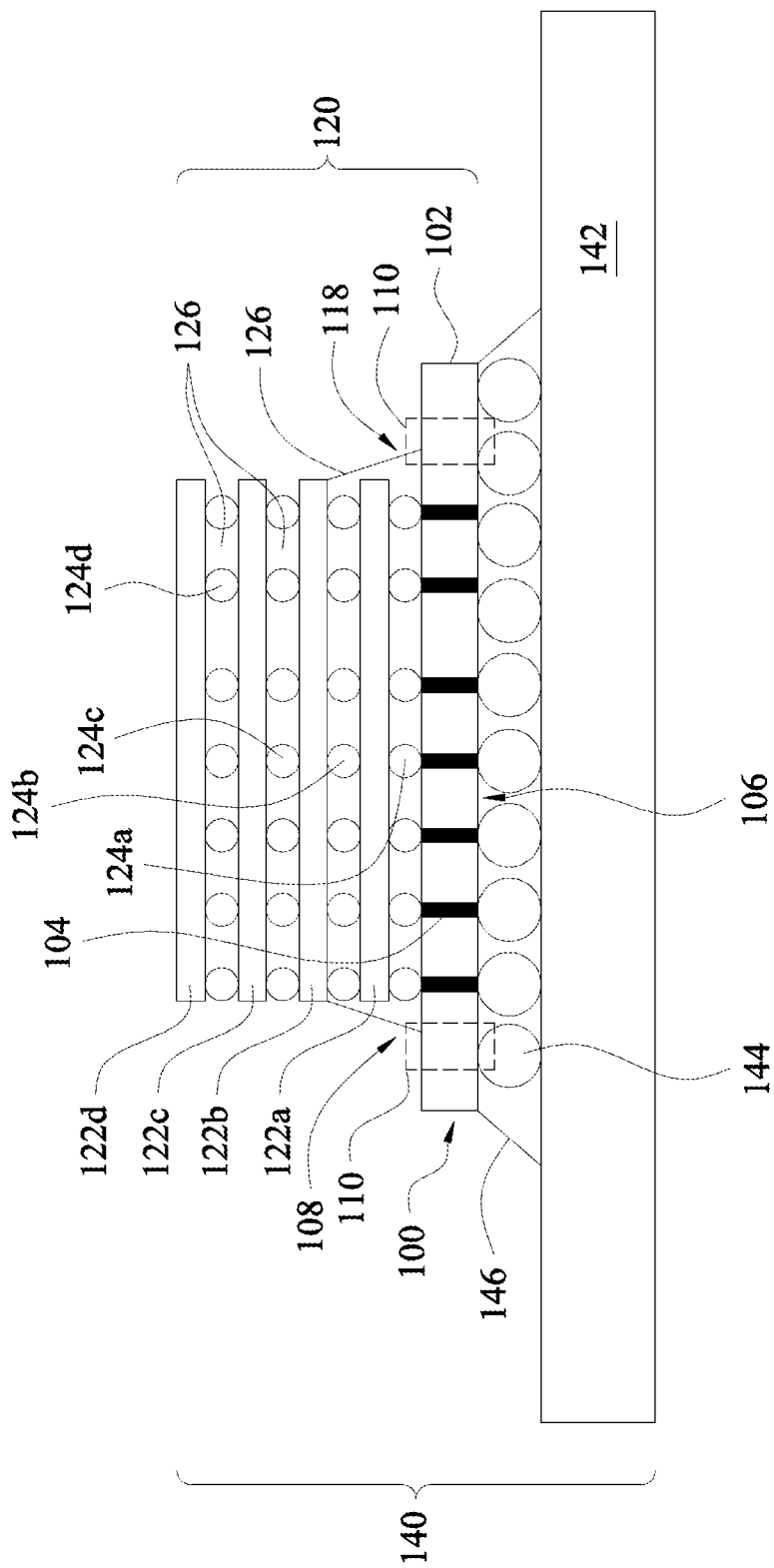
FIG. 5 is a cross-sectional view of a packaged semiconductor device in accordance with some embodiments that includes the plurality of microstructures.
Figure 6:
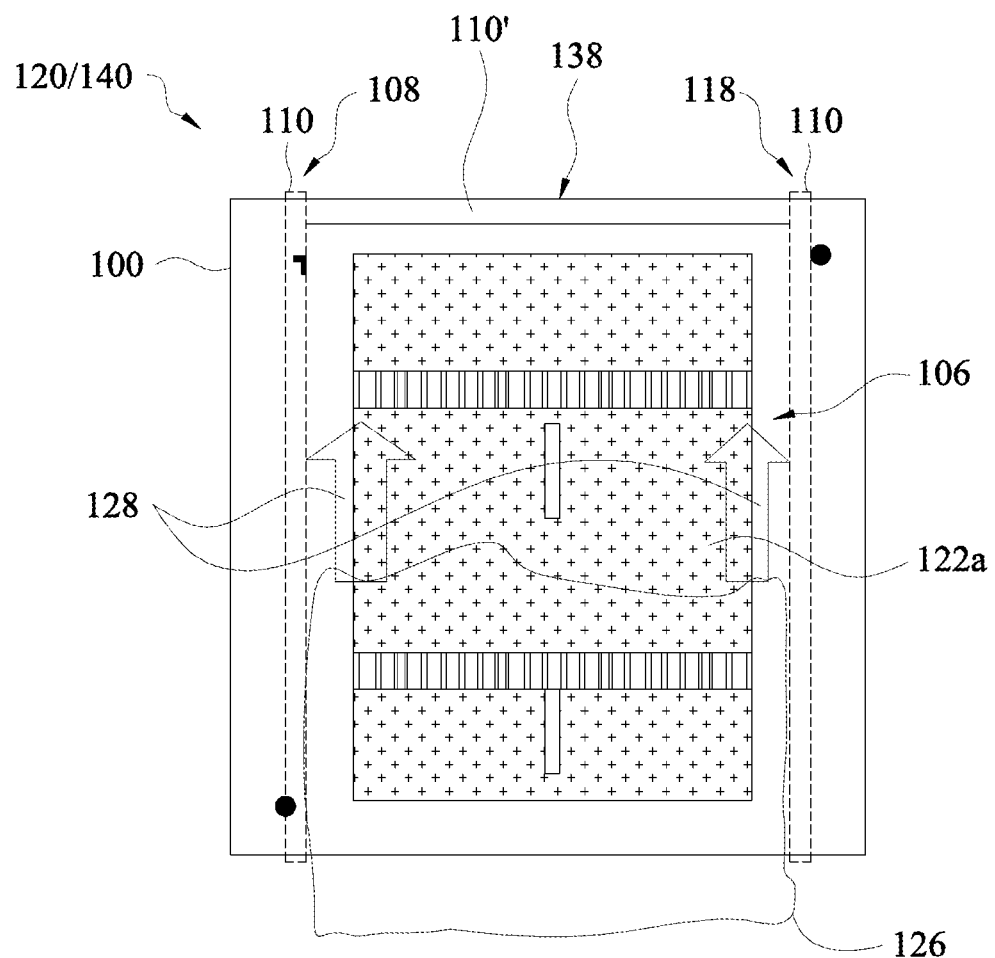
FIG. 6 is a top view of the packaged semiconductor device shown in FIG. 5 in accordance with some embodiments, illustrating the application of an underfill material between an integrated circuit die and a substrate.

For example, FIG. 5 is a cross-sectional view and FIG. 6 is a top view of a packaged semiconductor device 120 and/or 140 in accordance with some embodiments of the present disclosure that includes the plurality of microstructures 110. A plurality of integrated circuit dies 122a, 122b, 122c, and 122d is stacked vertically over a packaging device 100 that includes the plurality of microstructures 110 disposed on the substrate 102 of the packaging device 100 proximate a side 108 and 118 of the integrated circuit die mounting region 106 of the substrate 102.

Integrated circuit die 122a is coupled to the packaging device 100 using a plurality of connectors 124a. The connectors 124a are coupled to the through-vias 104 of the packaging device 100 or to contact pads 103 (see FIG. 1) disposed on the substrate 102 of the packaging device 100.

The plurality of microstructures 110 is disposed on the substrate 102 of the packaging device 100 proximate a side 108 of the integrated circuit die mounting region 106 of the substrate 102, as described for the embodiments shown in FIGS. 3 and 4.

However, in the embodiments shown in FIGS. 5 and 6, a plurality of microstructures 110 is disposed on the substrate 102 of the packaging device 100 proximate a side 118 of the integrated circuit die mounting region 106 of the substrate 102, wherein the side 118 of the integrated circuit die mounting region 106 is opposite side 108 of the integrated circuit die mounting region 106. Side 108 comprises a first side, and side 118 comprises a second side, in some embodiments, for example. The plurality of microstructures 110 disposed proximate the first side 108 comprise a first plurality of microstructures 110, and the plurality of microstructures 110 disposed proximate the second side 118 comprises a second plurality of microstructures 110 in some embodiments, for example. Including microstructures 110 on both sides 108 and 118 of the packaging device 100 and within a packaged semiconductor device 120 advantageously prevents spreading of the underfill material 126 past the microstructures 110 proximate the sides 108 and 118 of the integrated circuit die mounting region 106.

In some embodiments, a packaged semiconductor device 120 further comprises a third plurality of microstructures 110' disposed on the substrate 102 of the packaging device 100 proximate a third side 138 of integrated circuit die mounting region 106, which is also shown in FIG. 6. The third side 138 of the integrated circuit die mounting region 106 extends between the first side 108 and the second side 118 proximate a perimeter of the integrated circuit die mounting region 106. The first side 108, the third side 138, and the second side 118 collectively form substantially a shape of a U or C in a top view, for example. Including the microstructures 110 and 110' on three sides of the integrated circuit die mounting region 106 advantageously provides improved control of the application of the underfill material 126.

The second plurality of microstructures 110 and the third plurality of microstructures 110' may also be included on other sides of the integrated circuit die mounting regions 106a, 106b, and/or 106c in the embodiments shown in FIGS. 3 and 4 in accordance with some embodiments.

Referring again to FIG. 5, integrated circuit die 122b is coupled to a top surface of integrated circuit die 122a by a plurality of connectors 124b. Likewise, integrated circuit die 122c is coupled to a top surface of integrated circuit die 122b by a plurality of connectors 124c, and integrated circuit die 122d is coupled to a top surface of integrated circuit die 122c by a plurality of connectors 124d. One or more of the integrated circuit dies 122a, 122b, 122c, and 122d may include through-vias and/or interconnect structures that provide vertical and horizontal electrical connections, respectively, for the integrated circuit dies 122a, 122b, 122c, and 122d. Underfill material 126 may also be applied between adjacent integrated circuit dies 122a, 122b, 122c, and 122d.

Only four integrated circuit dies 122a, 122b, 122c, and 122d are shown in FIG. 5; however, two, three, or five or more integrated circuit dies 122a, 122b, 122c, and 122d may be stacked and packaged together in accordance with embodiments of the present disclosure. The application of the underfill material 126 between the substrate 102 of the packaging device 100 and the bottom integrated circuit die 122a is advantageously more controlled, due to the inclusion of the novel microstructures 110 and/or 110' on the sides 108 and 118 (and also side 138 in some embodiments) of the integrated circuit die mounting region 106.

FIG. 6 also illustrates the application of the underfill material 126 between the bottom integrated circuit die 124a in the stack and a substrate 102 of the packaging device 100. Including the microstructures 110 proximate the opposing sides 108 and 118 of the integrated circuit die mounting region 106 advantageously maintains the flow of the underfill material 126 in a single direction through the two sets of microstructures 110, as indicated by arrows 128.

As described for the embodiments shown in FIGS. 3 and 4, the packaged semiconductor device 120 may then be coupled to another substrate 142 by a plurality of connectors 144 in some embodiments to form a packaged semiconductor device 140, which is shown in FIG. 5. In other embodiments, the packaged semiconductor device 120 is not coupled to another substrate 142.

Figure 7:
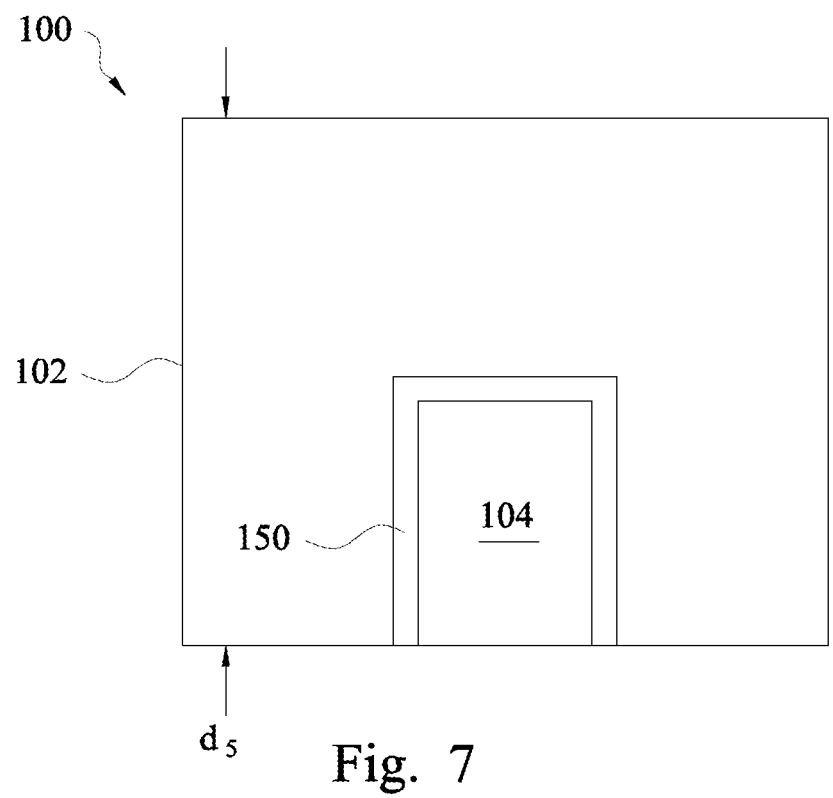
FIGS. 7 through 13 are cross-sectional views illustrating a method of fabricating a packaging device at various stages in accordance with some embodiments.

FIGS. 7 through 13 are cross-sectional views illustrating a method of fabricating a packaging device 100 at various stages in accordance with some embodiments. In FIG. 7, a substrate 102 is provided. The substrate 102 is initially in wafer form in some embodiments and comprises an initial thickness comprising dimension $d_5$, wherein dimension $d_5$ comprises about 700 μm in some embodiments. Dimension $d_5$ may alternatively comprise other values.

The substrate 102 includes a plurality of through-vias 104 formed therein. The through-vias 104 are formed partially through the substrate 102 in some embodiments, as illustrated in FIG. 7. Alternatively, the through-vias 104 may be formed completely through the substrate 102.

The through-vias 104 are lined with an insulating material 150 in some embodiments. The insulating material 150 comprises a thickness of about 1 μm to about 10 μm in some embodiments, for example. The insulating material 150 may comprise an oxide, other type of insulating material, or combinations or multiple layers thereof, for example. Alternatively, the insulating material 150 may comprise other materials and dimensions, and/or the insulating material 150 may not be included.

Figure 8:
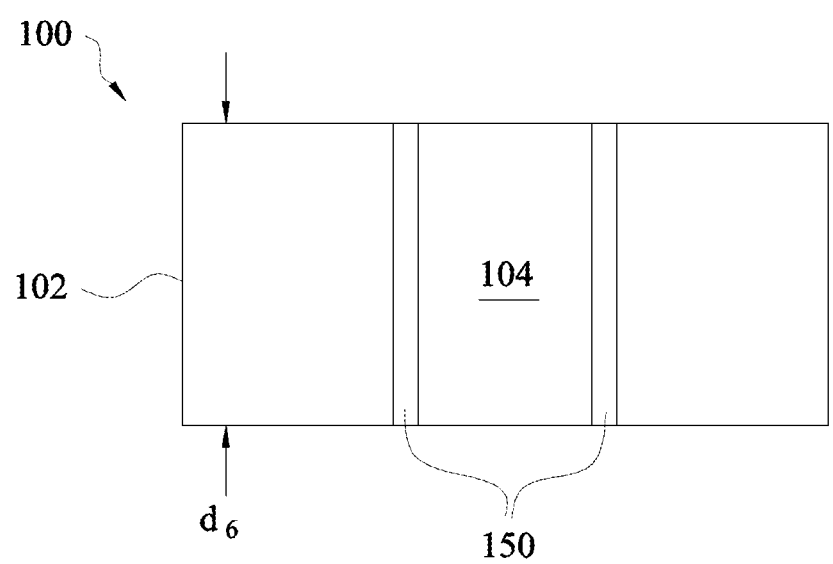

The substrate 102 is subjected to a grinding process, as shown in FIG. 8. A thickness of the substrate 102 is thinned from dimension $d_5$ shown in FIG. 7 to a dimension $d_6$ shown in FIG. 8. Dimension $d_6$ comprises about 50 μm to about 100 μm in some embodiments, for example. Dimension $d_6$ may alternatively comprise other values.

Figure 9:
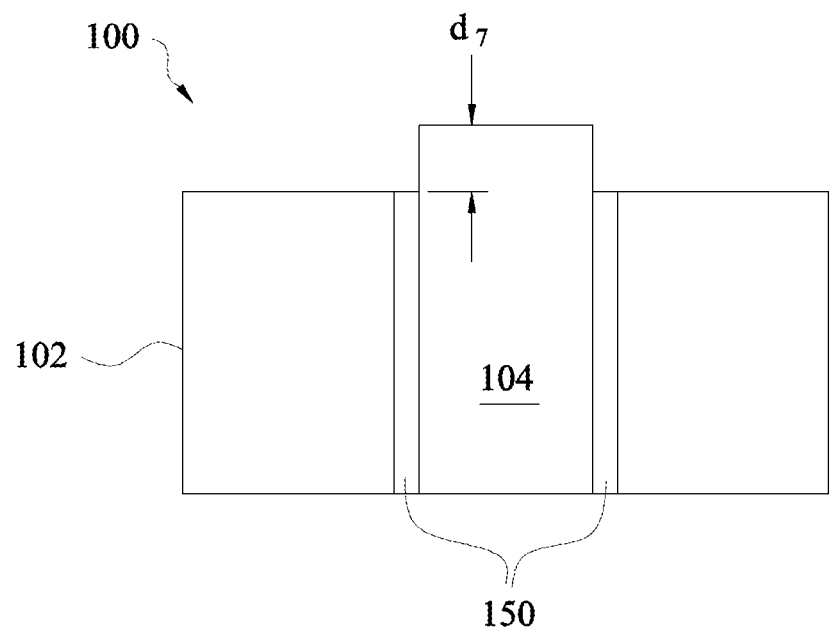

An etch process is used to recess the material of the substrate 102, as shown in FIG. 9. The substrate 102 is recessed by an amount comprising dimension $d_7$, wherein dimension $d_7$ comprises about 1.2 μm in some embodiments, for example. Dimension $d_7$ may alternatively comprise other values. In embodiments wherein the substrate comprises silicon, the substrate may be recessed using a blanket silicon etch process, for example.

Recessing the substrate 102 creates bumps or pillars that extend above the top surface of the substrate 102 in some embodiments. The bumps or pillars comprise the same material as the through-vias 104. The bumps or pillars form the microstructures 110 described herein in some embodiments. In other embodiments, the bumps or pillars form a portion of the microstructures 110.

Figure 10:
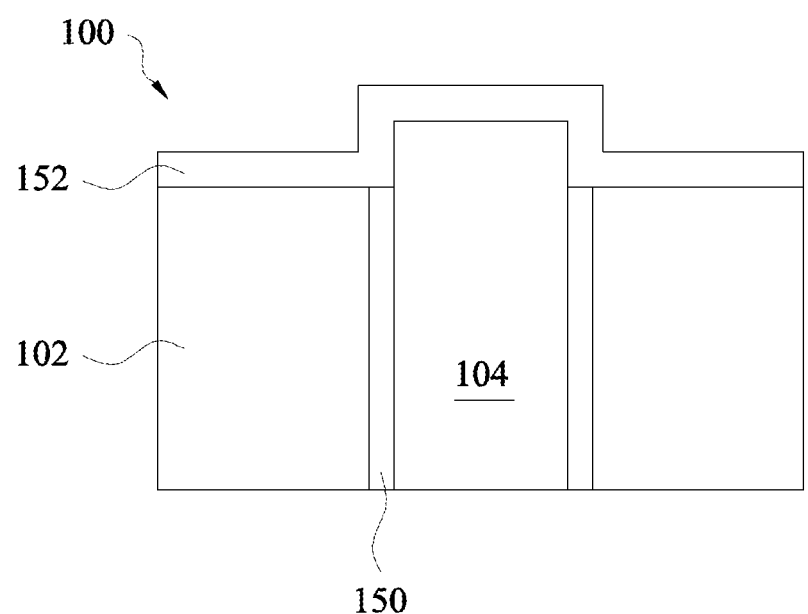

In FIG. 10, an insulating material 152 is then formed over the bumps or pillars that extend from the through-vias 104 and the recessed substrate 102. The insulating material 152 comprises silicon nitride having a thickness of about 1.4 μm in some embodiments, for example. Alternatively, the insulating material 152 may comprise other materials and dimensions.

Figure 11:
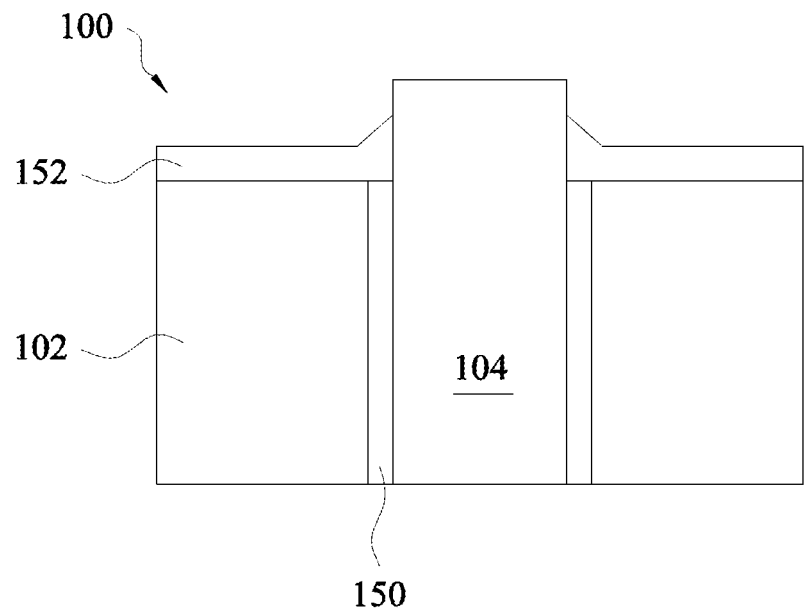

The insulating material 152 is removed from the top surface of the bumps or pillars that extend from the through-vias 104, and a top portion of the insulating material 152 is removed using an etch-back process, as shown in FIG. 11. A top portion of the bumps or pillars that extend from the through-vias 104 is exposed through the insulating material 152. About 0.2 μm to about 0.3 μm of the bumps or pillars that extend from the through-vias 104 may extend past a top surface of the insulating material 152, for example.

Figure 12:
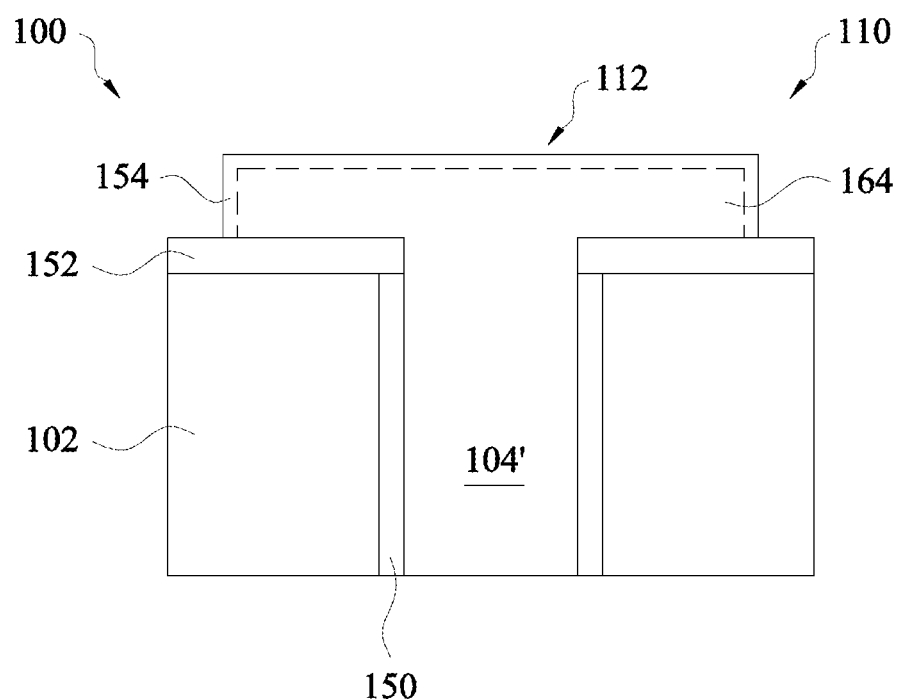
Figure 13:
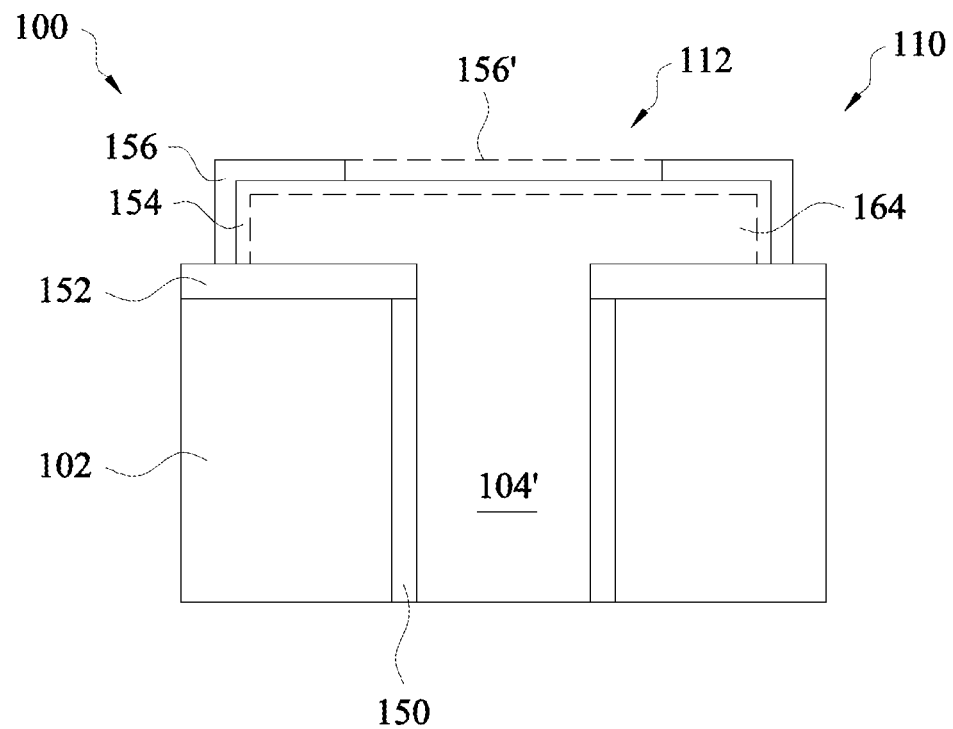

In some embodiments, additional conductive material is added to enlarge the bumps or pillars, as shown in FIGS. 12 and 13. In other embodiments, additional conductive material is not added. For example, the microstructures 110 described herein may comprise the bumps or pillars shown in FIGS. 10 and/or 11, in some embodiments.

The additional conductive material 164 shown ind FIG. 12 may be added during the formation of conductive features of a redistribution layer (RDL) of the packaging device 100 in some embodiments. The additional conductive material 164 may be added during the formation of contact pads 103 (see FIG. 1) or other conductive features, for example. More details regarding the formation of the additional conductive material 164 will be described further herein with reference to FIGS. 14 through 18, for example. In some embodiments, an insulating material 154 comprising copper oxide is formed over the additional conductive material 164, which will also be described further herein.

An insulating material 156 is formed over insulating material 152 and portions of the additional conductive material 164 in some embodiments. The insulating material 156 comprises the same material as insulating material 152, in some embodiments. Alternatively, insulating material 156 may comprise a different material than insulating material 152. Insulating material 156 comprises about 0.4 μm of silicon nitride in some embodiments. Alternatively, insulating material 156 may comprise other materials and dimensions.

In some embodiments, a portion of the insulating material 156 is removed from a top surface of the additional conductive material 164. In other embodiments, a portion of the insulating material 156 is not removed, and the portion 156' of the insulating material is left remaining over the top surface of the additional conductive material 164. Thus, a microstructure 110 is formed that comprises a bump or pillar 112.

Figure 14:
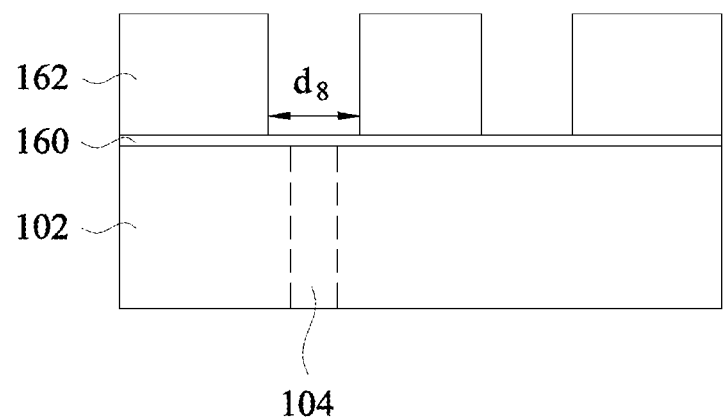
FIGS. 14 through 18 are cross-sectional views that illustrate a method of fabricating a plurality of the microstructures of a packaging device at various stages in accordance with some embodiments.

FIGS. 14 through 18 are cross-sectional views that illustrate a method of fabricating a plurality of microstructures 110 of a packaging device 100 at various stages in accordance with some embodiments. In FIG. 14, a substrate 102 is provided. The substrate 102 may include a plurality of through-vias 104' (shown in phantom in FIG. 14) formed therein.

A seed layer 160 is formed over the substrate 102. The seed layer 160 comprises a conductive material such as copper or a copper alloy and comprises a thickness of about 0.5 μm to about 1 μm, for example. Alternatively, the seed layer 160 may comprise other materials and dimensions.

A layer of photoresist 162 is formed over the seed layer 160. The photoresist 162 is patterned using lithography with a desired pattern for bumps or pillars 112 of the microstructures described herein. The photoresist 162 is patterned in some embodiments using a defocus-induced small critical dimension (CD) in some embodiments. The patterns in the photoresist 162 may comprise a width comprising a dimension $d_8$, wherein dimension $d_8$ comprises about 10 μm or less in some embodiments, for example. Dimension $d_8$ may alternatively comprise other values. Some or all of the patterns in the photoresist 162 may be formed over through-vias 104' within the substrate 102, in some embodiments. In other embodiments, none of the patterns in the photoresist 162 are formed over through-vias 104 or 104'.

Figure 15:
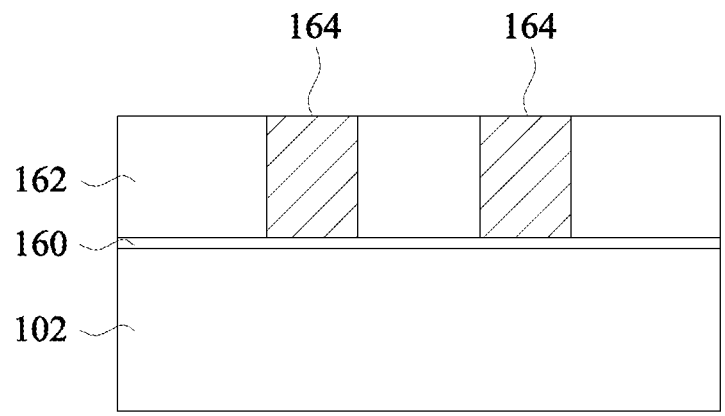
Figure 16:
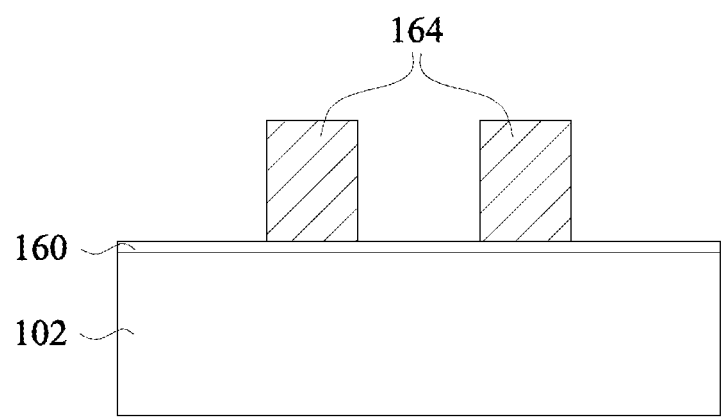
Figure 17:
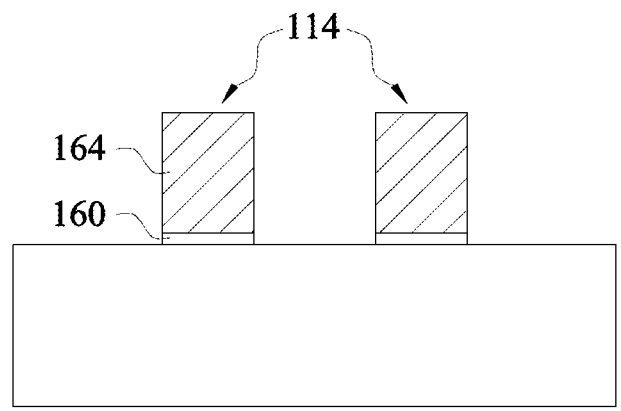

A conductive material 164 is then plated onto the seed layer 160 through the patterns in the photoresist 162, as shown in FIG. 15. The conductive material 164 comprises copper, a copper alloy, or other metals in some embodiments. Alternatively, the conductive material 164 may comprise other materials. The layer of photoresist 162 is then removed, as shown in FIG. 16. The seed layer 160 is then etched away, leaving conductive material 114 (see also FIG. 14) which is comprised of conductive material 164 and the seed layer 160, as shown in FIG. 17. A top portion of the conductive material 164 may be etched away or removed when removing the seed layer 160, for example.

Figure 18:
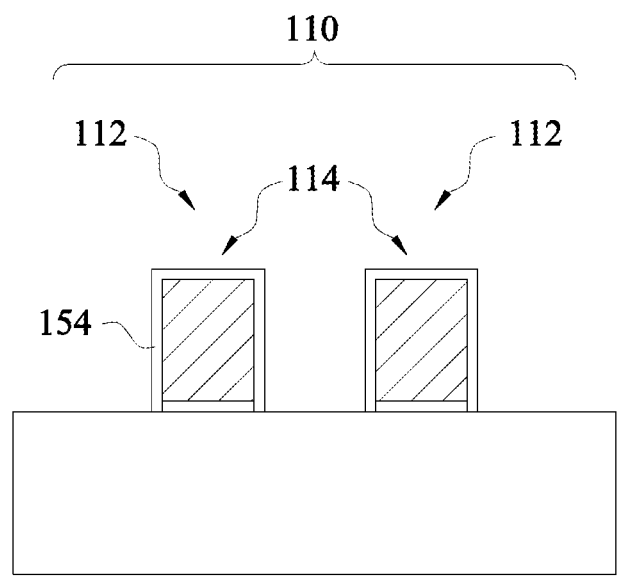

An insulating material 154 is then formed over the conductive material 114, as shown in FIG. 18. The insulating material 154 may be formed by heating the packaging device 100 in an oven, to oxidize the conductive material 114. In embodiments wherein the conductive material 114 comprises copper or a copper alloy, the insulating material 154 may comprise copper oxide, as an example. Heating the conductive material 114 comprising copper may comprise the reaction:

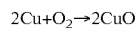

$$2Cu+O_2 \rightarrow 2CuO$$

in some embodiments, for example. In FIG. 1, insulating material 116 may comprise insulating material 154 that comprises copper oxide in some embodiments, for example.

Thus, a plurality of microstructures 110 is formed that includes a plurality of bumps or pillars 112 that comprise a conductive material 114 and an insulating material 154 disposed over the conductive material.

Embodiments of the present disclosure provide 3DICs that include the novel underfill material application controlling microstructures 110 and 110' formed thereon. The microstructures 110 and 110' may also be implemented in packaging devices 100 that are used to package single integrated circuit dies. For example, in FIG. 5, a single integrated circuit die 122a can be packaged using the novel packaging devices 100 described herein. The microstructures 110 may be included on two sides 108 and 118 of the integrated circuit die mounting region 106, or the microstructures 110 and 110' may be included on three sides 108, 118, and 138 of the integrated circuit die mounting region 106.

The integrated circuit dies 122a, 122b, 122c, and 122d described herein may comprise the same or different types of circuitry and/or functions. The integrated circuit dies 122a, 122b, 122c, and 122d comprise known good dies (KGD) in some embodiments, for example. The packaged semiconductor devices 120 and 140 may comprise system on a chip (SOC) devices or chip on wafer on substrate (CoWoS) devices, as examples.

Advantages of some embodiments of the present disclosure include providing novel packaging devices and methods wherein embedded microstructures are used to control the application of underfill materials. The microstructures comprise bumps or pillars that protrude from through-vias, or bumps or pillars that can be fabricated using bumping techniques or during the formation of other material layers of the packaging device, such as RDLs. The microstructures comprise a hydrophobic material and prevent or reduce spreading of a subsequently applied underfill material past the microstructures. The microstructures provide improved control of underfill fillet width, which further results in improved thermal performance and assembly yields.

The hydrophobic surfaces of the microstructures are achieved by surface roughness and chemistry, e.g., of the outer insulating materials of the bumps or pillars. The packaging processes result in cleaner joint pads (e.g., of connectors), which results in increased assembly yields. Air gaps can be maintained between adjacent integrated circuit dies (e.g., in the embodiments shown in FIGS. 3 and 4), which is advantageous for integrated circuit dies that require increased thermal dissipation. Furthermore, the novel microstructures and fabrication methods are easily implementable in packaging and manufacturing process flows.

In accordance with some embodiments, a packaging device includes a substrate. The substrate has an integrated circuit die mounting region disposed thereon. The packaging device also includes a plurality of microstructures disposed proximate a side of the integrated circuit die mounting region of the substrate.

In accordance with other embodiments, a packaged semiconductor device includes a substrate having an integrated circuit die mounting region disposed thereon, and a plurality of microstructures disposed on the substrate proximate a side of the integrated circuit die mounting region of the substrate. An integrated circuit die is coupled to the integrated circuit die mounting region of the substrate.

In accordance with yet other embodiments, a method of packaging a semiconductor device includes providing a packaging device, the packaging device comprising a substrate including an integrated circuit die mounting region disposed thereon and a plurality of microstructures disposed proximate a side of the integrated circuit die mounting region. An integrated circuit die is coupled to the integrated circuit die mounting region. An underfill material is disposed between the substrate and the integrated circuit die. The plurality of microstructures prevents spreading of the underfill material on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaging device, comprising:
a substrate including an integrated circuit die mounting region disposed thereon; and
a plurality of microstructures disposed proximate a side of the integrated circuit die mounting region of the substrate, wherein the plurality of microstructures each comprises an outer insulating layer over a conductive material, wherein the plurality of microstructures comprises a plurality of bumps or pillars, and wherein the plurality of bumps or pillars comprises copper or a copper alloy.

2. The packaging device according to claim 1, wherein the outer insulating layer of the plurality of bumps or pillars comprises copper oxide or silicon nitride.

3. The packaging device according to claim 1, wherein each of the plurality of bumps or pillars extends from a respective through-via in the substrate.

4. The packaging device according to claim 1, wherein the substrate comprises an interposer substrate or an integrated circuit die.

5. The packaging device according to claim 1, wherein the plurality of microstructures is hydrophobic.

6. The packaging device according to claim 3, wherein the microstructures are hydrophobic.

7. A packaged semiconductor device, comprising:
a substrate including an integrated circuit die mounting region disposed thereon;
a plurality of columnar hydrophobic microstructures disposed on the substrate perpendicular to a major surface of the substrate and proximate a side of the integrated circuit die mounting region of the substrate;
an integrated circuit die coupled to the integrated circuit die mounting region of the substrate; and
an underfill material disposed between the substrate and the integrated circuit die.

8. The packaged semiconductor device according to claim 7, wherein the underfill material does not extend past the plurality of microstructures.

9. The packaged semiconductor device according to claim 7, wherein the substrate includes a plurality of integrated circuit die mounting regions disposed thereon, wherein the plurality of microstructures is disposed between two of the plurality of integrated circuit die mounting regions, and wherein the packaged semiconductor device includes an integrated circuit die coupled to each of the plurality of integrated circuit die mounting regions of the substrate.

10. The packaged semiconductor device according to claim 7, wherein the integrated circuit die includes a first integrated circuit die, and wherein the packaged semiconductor device includes a second integrated circuit die coupled to a top surface of the first integrated circuit die.

11. The packaged semiconductor device according to claim 10, wherein the packaged semiconductor device includes a plurality of the second integrated circuit dies coupled in a stack over the first integrated circuit die.

12. The packaged semiconductor device according to claim 10, wherein the plurality of microstructures comprises a first plurality of microstructures disposed on the substrate proximate a first side of the integrated circuit die mounting region of the substrate, and wherein the packaged semiconductor device further comprises a second plurality of microstructures disposed on the substrate proximate a second side of the integrated circuit die mounting region, the second side being opposite the first side.

13. The packaged semiconductor device according to claim 12, wherein the packaged semiconductor device further comprises a third plurality of microstructures disposed on the substrate proximate a third side of integrated circuit die mounting region, and wherein the third side extends between the first side and the second side proximate a perimeter of the integrated circuit die mounting region.

14. The packaged semiconductor device of claim 7, wherein the plurality of microstructures comprises a plurality of copper or copper alloy bumps or pillars.

15. A packaging device, comprising:
a substrate having a first integrated circuit (IC) die mounting region and a second IC die mounting region disposed thereon, the second IC die mounting region disposed next to the first IC die mounting region in plan view;

a border region of the substrate between the first IC die mounting region and the second IC die mounting region; and a plurality of hydrophobic microstructures disposed in the border region of the substrate.

16. The packaging device of claim 15, further comprising:

a first IC mounted in the first IC die mounting region; and an underfill material disposed between the substrate and the first IC and reaching the plurality of microstructures.

17. The packaging device of claim 16, wherein:

the first IC has a proximate edge along the border region and a distal edge along an edge opposite to the proximate edge, and in cross section view, the first IC is mounted parallel to the substrate and an edge of underfill material located at the proximate edge is not parallel to an edge of the underfill material located at the distal edge.

18. The packaging device of claim 16, wherein an edge of the first IC overlaps the border region in plan view.

19. The packaging device of claim 16, further comprising:

a second plurality of microstructures disposed along two sides of the first IC die mounting region, wherein the two sides are perpendicular to the border region in plan view.

20. The packaging device according to claim 15, wherein the plurality of microstructures comprises a plurality of copper or copper alloy bumps or pillars.

* * * * *